(12) United States Patent
Lu et al.

(10) Patent No.: US 9,159,455 B2
(45) Date of Patent: Oct. 13, 2015

(54) DATA RETENTION ERROR DETECTION SYSTEM (71) Applicant: QUALCOMM Incorporated, San Diego, CA (US)

(72) Inventors: Xiao Lu, San Diego, CA (US); Wah Nam Hsu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 10 days.

(21) Appl. No.: 14/138,059

(22) Filed: Dec. 21, 2013

(65) Prior Publication Data

US 2015/0179281 A1 Jun. 25, 2015

(51) Int. Cl.
G11C 11/00 (2006.01)
G11C 29/10 (2006.01)
G06F 11/07 (2006.01)
G11C 29/50 (2006.01)
G11C 11/16 (2006.01)

(52) U.S. Cl.
CPC .............. *G11C 29/10* (2013.01); *G06F 11/073* (2013.01); *G11C 29/50016* (2013.01); *G11C 11/16* (2013.01)

(58) Field of Classification Search
USPC .................................................. 365/158, 171
See application file for complete search history.

(56) References Cited

U.S. PATENT DOCUMENTS

| 7,165,197 | B2 | 1/2007 | Park et al. | |
|---|---|---|---|---|
| 8,553,452 | B2 | 10/2013 | Zhou et al. | |
| 2007/0165450 | A1* | 7/2007 | Boeve | 365/158 |
| 2008/0180109 | A1 | 7/2008 | Gregoritsch et al. | |
| 2013/0301335 | A1 | 11/2013 | Ong | |
| 2014/0070800 | A1* | 3/2014 | Cho et al. | 324/228 |

FOREIGN PATENT DOCUMENTS

WO 2010038823 A1 4/2010

OTHER PUBLICATIONS

International Search Report and Written Opinion—PCT/US2014/067961—ISA/EPO—Mar. 6, 2015.

* cited by examiner

*Primary Examiner* — Hoai V Ho
(74) *Attorney, Agent, or Firm* — Toler Law Group, PC (57) ABSTRACT A particular method includes selecting a threshold data retention time of a magnetic tunnel junction (MTJ) memory cell. A pinned layer of the MTJ memory cell has a first direction of magnetization, and a free layer of the MTJ memory cell has a second direction of magnetization. An external magnetic field that has a third direction of magnetization that is opposite to the second direction of magnetization is applied to the MTJ memory cell. A strength of the external magnetic field is determined based on the threshold data retention time. Subsequent to applying the external magnetic field, a read operation is performed on the MTJ memory cell to determine a logic value of the MTJ memory cell. The method further includes determining whether the MTJ memory cell is subject to a data retention error corresponding to the threshold data retention time based on the logic value.

30 Claims, 5 Drawing Sheets

DATA RETENTION ERROR DETECTION SYSTEM

I. FIELD

The present disclosure is generally related to a data retention error detection system.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

A computing device may include a memory (e.g., magnetoresistive random-access memory (MRAM)) used to store data. A MRAM device may include magnetic tunnel junction (MTJ) devices as storage elements. MTJ devices include a free layer and a pinned layer and may store data based on an orientation of the free layer relative to the pinned layer. For example, a MTJ device may store a logic zero when the free layer and the pinned layer of the MTJ device are magnetized in the same direction (e.g., parallel state). The logic zero may be detected during a read operation by determining that a resistance of the MTJ device is in a certain range. The MTJ device may store a logic one when the free layer is magnetized in a direction opposite to the direction of magnetization of the pinned layer (e.g., an anti-parallel state). The logic one may be detected during a read operation by determining that the resistance of the MTJ device is in a second, higher range (because a MTJ device in the anti-parallel state has higher resistance than a MTJ device in the parallel state).

Data errors may occur at the memory, causing data read from the memory to differ from data written to the memory. For example, certain data errors may be caused by data retention, where a data error occurs at a MTJ device after a particular amount of time at a particular temperature (e.g., 10 years at room temperature). The MTJ device may be tested to determine whether the MTJ device is prone to data retention errors by subjecting the MTJ device to a high temperature for a particular amount of time. For example, the MTJ device may be tested to determine whether the MTJ device is prone to data retention errors corresponding to 10 years at room temperature by baking the MTJ device in an oven for 7 days at 105 degrees Celsius. Performing a baking procedure on the MTJ device to test the MTJ device delays distribution and/or use of the MTJ device.

III. SUMMARY

This disclosure presents embodiments of a data retention error detection system. The data retention error detection system may include a magnetic field generation device and a controller (e.g., a processor and a memory). The data retention error detection system may be configured to detect whether a memory device including one or more magnetic tunnel junction (MTJ) memory cells is prone to data retention errors by applying an external magnetic field to the whole memory device including every MTJ memory cell (e.g., for 1 second). A strength of the external magnetic field may correspond to a threshold data retention time corresponding to a data retention error. Each MTJ memory cell of the memory device may be subsequently read to determine whether the MTJ memory cell is subject to data retention errors. Thus, a memory device may be tested for potential data retention errors more quickly than testing memory devices using a baking procedure.

In a particular embodiment, a method includes selecting a threshold data retention time of a magnetic tunnel junction (MTJ) memory cell. A pinned layer of the MTJ memory cell is configured to have a first direction of magnetization, and a free layer of the MTJ memory cell is configured to have a second direction of magnetization. The method further includes applying an external magnetic field to the MTJ memory cell. The external magnetic field has a third direction of magnetization that is opposite to the second direction of magnetization. A strength of the external magnetic field is determined based on the threshold data retention time. The method further includes, subsequent to applying the external magnetic field, performing a read operation on the MTJ memory cell to determine a logic value of the MTJ memory cell. The method further includes determining whether the MTJ memory cell is subject to a data retention error corresponding to the threshold data retention time based on the logic value.

In another particular embodiment, an apparatus includes a magnetic field generation device configured to apply an external magnetic field to a magnetic tunnel junction (MTJ) memory cell. The external magnetic field has a first direction of magnetization that is opposite to a second direction of magnetization. A free layer of the MTJ memory cell is configured to have the second direction of magnetization. A strength of the external magnetic field is determined based on a threshold data retention time. The apparatus further includes a controller coupled to the magnetic field generation device. The controller is configured to, subsequent to application of the external magnetic field to the MTJ memory cell, perform a read operation on the MTJ memory cell to determine a logic value of the MTJ memory cell. The controller is further configured to determine whether the MTJ memory cell is subject to a data retention error corresponding to the threshold data retention time based on the logic value.

In another particular embodiment, an apparatus includes means for generating a magnetic field configured to apply an external magnetic field to a magnetic tunnel junction (MTJ) memory cell. The external magnetic field has a first direction of magnetization that is opposite to a second direction of magnetization. A free layer of the MTJ memory cell is configured to have the second direction of magnetization. A strength of the external magnetic field is determined based on a threshold data retention time. The apparatus further includes controlling means coupled to the means for generating the magnetic field. The controlling means is configured to, subsequent to application of the external magnetic field to the MTJ memory cell, perform a read operation on the MTJ memory cell to determine a logic value of the MTJ memory cell. The controlling means is further configured to determine whether the MTJ memory cell is subject to a data retention error corresponding to the threshold data retention time based on the logic value.

In another particular embodiment, an apparatus includes a memory device comprising a plurality of magnetic tunnel junction (MTJ) memory cells. The plurality of MTJ memory cells includes a primary cell that, when exposed to an external magnetic field, is subject to a data retention error corresponding to a threshold data retention time. The external magnetic field has a magnetic field strength determined based on the threshold data retention time. The plurality of MTJ memory cells further includes a redundant cell that, when exposed to the external magnetic field, is not subject to a data retention error. Data for the primary cell is stored at the redundant cell in response to a write instruction. Data is read from the redundant cell instead of the primary cell in response to a read instruction.

One particular advantage provided by at least one of the disclosed embodiments is that an electronic device including the data retention error detection system may test a memory device including one or more magnetic tunnel junction (MTJ) memory cells for potential data retention errors. The data retention error detection system may test the memory device for potential data retention errors more quickly than a system that tests memory devices using a baking procedure.

Other aspects, advantages, and features of the present disclosure will become apparent after review of the entire application, including the following sections: Brief Description of the Drawings, Detailed Description, and the Claims.

V. DETAILED DESCRIPTION

Figure 1:
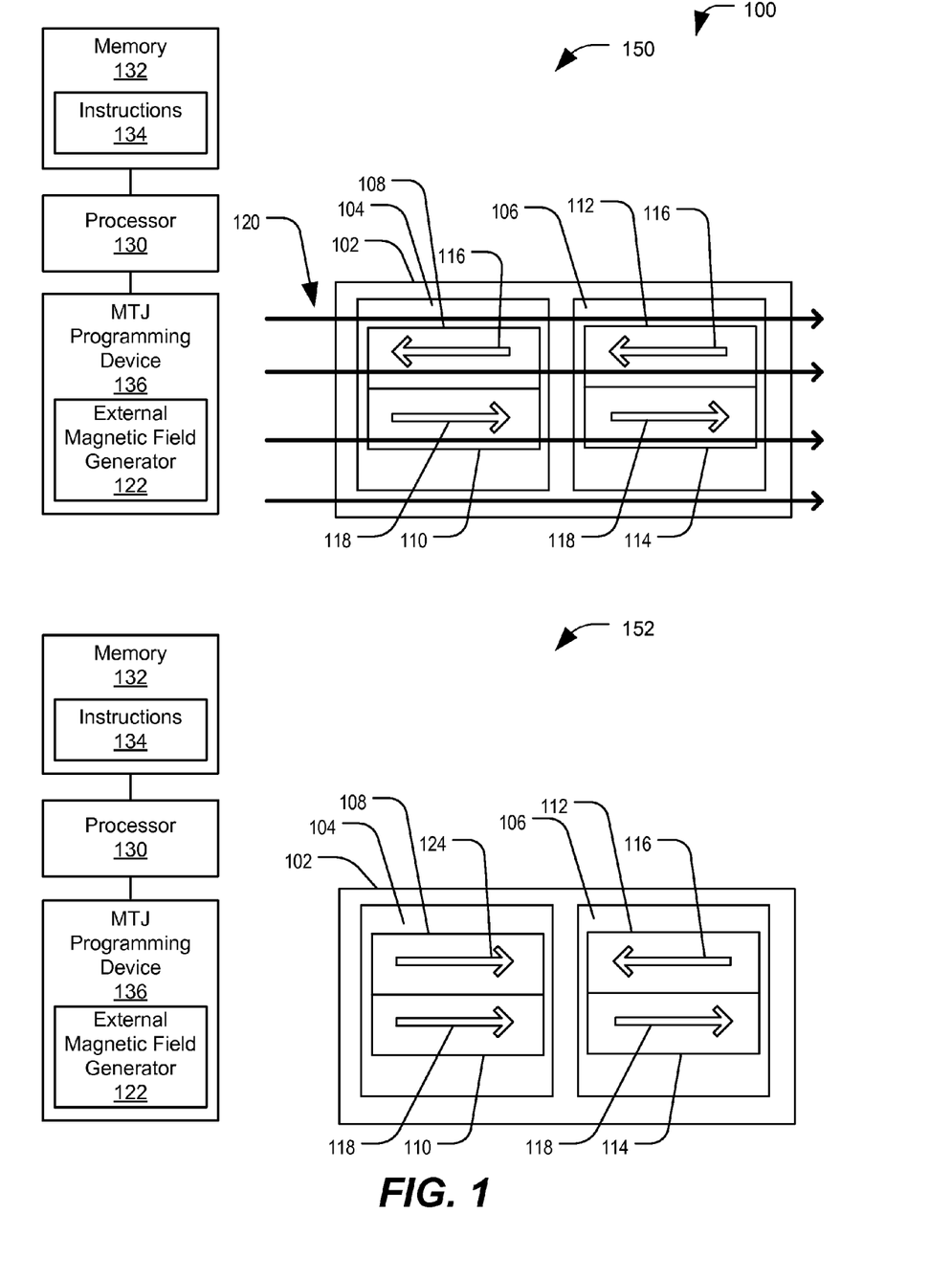
FIG. 1 is a diagram depicting a particular embodiment of a data retention error detection system.

FIG. 1 illustrates a first particular embodiment of a data retention error detection system 100 for testing a magnetic tunnel junction (MTJ) memory array 102 to determine whether MTJ memory cells (e.g., a first MTJ memory cell 104 and/or a second MTJ memory cell 106) of the MTJ memory array 102 are subject to a data retention error. FIG. 1 includes a first view 150 illustrating the MTJ memory array 102 including the first MTJ memory cell 104 and the second MTJ memory cell 106. The first MTJ memory cell 104 includes a first pinned layer 110 and a first free layer 108. The second MTJ memory cell 106 includes a second pinned layer 114 and a second free layer 112. The first MTJ memory cell 104 and the second MTJ memory cell 106 may each correspond to a single bit of the MTJ memory array 102.

The pinned layers 110, 114 and the free layers 108, 112 are programmed to particular orientations which correspond to stored logical values of the MTJ memory cells 104, 106. For example, the first pinned layer 110 has a first direction of magnetization 118 and the second pinned layer 114 has the first direction of magnetization 118. Additionally, the first free layer 108 has a second direction of magnetization 116 and the second free layer 112 has the second direction of magnetization 116. In the particular example illustrated in the first view 150, the directions of magnetization of the pinned layers 110, 114 (e.g., the first direction of magnetization 118) and the free layers 108, 112 (e.g., the second direction of magnetization 116) are antiparallel. However, the directions of magnetization of the pinned layers 110, 114 and the free layers 108, 112 may have another relationship (e.g., parallel).

FIG. 1 illustrates an external magnetic field generator 122 that may be configured to apply an external magnetic field 120 to the MTJ memory array 102. The external magnetic field generator 122 may be controlled by a controller (e.g., including a processor 130 and a memory 132) to perform a data retention error detection test with respect to the MTJ memory array 102. For example, the processor 130 may execute instructions 134 stored at the memory 132 to select a magnetic field strength of the external magnetic field 120 corresponding to a particular threshold data retention time for which the MTJ memory array 102 is to be tested. In a particular embodiment, the external magnetic field generator 122 may be included in a MTJ programming device 136. In other embodiments, the external magnetic field generator 122 may be separate or distinct from the MTJ programming device 136.

During operation, the external magnetic field generator 122 may apply the external magnetic field 120 to the MTJ memory array 102. The external magnetic field 120 has a direction of magnetization that is opposite to the direction of magnetization of the free layers 108, 112 (e.g., opposite to the second direction of magnetization 116). In a particular embodiment, a magnetic strength of the external magnetic field 120 may be selected or determined based on a threshold data retention time (e.g., 10 years). For example, the threshold data retention time may correspond to a desired data retention time (or a performance requirement) of the MTJ memory array 102. The threshold data retention time may be a quality control metric used to determine whether the MTJ memory array 102 sustains a program state for a specified period of time. The magnetic field strength of the external magnetic field 120 may be selected to test the endurance of data retention by the first MTJ memory cell 104.

The controller (e.g., the processor 130) may determine a strength of the external magnetic field 120 based on relationship data that describes a relationship between the external field strength and a threshold data retention time. The relationship data may be based on empirical data, historical testing data (e.g., data corresponding to data retention tests performed on similar MTJ memory devices), or both. For example, a particular method of determining the relationship between magnetic field strength and threshold data retention time is illustrated and described below with reference to FIG. 2. In a particular embodiment, the processor 130 selects the magnetic field strength based on the instructions 134 and provides an indication of the magnetic field strength to the external magnetic field generator 122. The external magnetic field 120 may be applied for a time duration sufficient to cause a change in direction of magnetization of a MTJ memory cell that is subject to a data retention error. For example, the external magnetic field 120 may cause a change in direction of magnetization of a MTJ memory cell that is subject to a data retention error in less than 1 second.

FIG. 1 also includes a second view 152 corresponding to a state of the MTJ memory array 102 after application of the external magnetic field 120. As illustrated in the second view 152, the first free layer 108 of the first MTJ memory cell 104 has changed to a third direction of magnetization 124 that corresponds to a direction of magnetization of the external magnetic field 120. The change in direction of magnetization corresponds to a change in a logical value stored at the first MTJ memory cell 104, indicating a data retention error at the threshold data retention time. However, the second free layer 112 of the second MTJ memory cell 106 maintains the second direction of magnetization 116 indicating no data retention error in the second MTJ memory cell 106 at the threshold data retention time.

In a particular embodiment, the MTJ programming device 136, the processor 130, or another device may perform a read operation on the MTJ memory cells 104, 106 subsequent to applying the external magnetic field 120 to determine a logical value stored at each of the MTJ memory cells 104, 106. The processor 130 may determine whether each of the MTJ memory cells 104, 106 is subject to a data retention error corresponding to the threshold data retention time based on logical values stored at each of the MTJ memory cells 104, 106. Accordingly, the processor 130 may determine that the first MTJ memory cell 104 is subject to a data retention error based on the direction magnetization of the first free layer 108 switching to the third direction of magnetization 124 after application of the external magnetic field 120 (e.g., indicating a different logical value then was stored before application of the external magnetic field 120). However, the processor 130 may determine that the second MTJ memory cell 106 passes the test and is not subject to a data retention error based on the second free layer 112 having the second direction of magnetization 116 after application of the external magnetic field 120 (e.g., indicating that the logical value stored at the second MTJ memory cell 106 is the same as prior to application of the external magnetic field 120).

In a particular embodiment, when the processor 130 detects a MTJ memory cell that fails the data retention error test (e.g., the first MTJ memory cell 104), the processor 130 may cause the particular MTJ memory cell to be replaced or avoided. For example, as described below with reference to FIG. 4, the MTJ memory array 102 may include both primary cells and redundant cells. When the particular MTJ memory cell that fails the data retention error test is a primary cell, the processor 130 may cause the MTJ memory array 102 to be reconfigured such that data to be stored at the particular MTJ memory cell is stored at a redundant cell. In a particular embodiment, if the processor 130 determines that a MTJ memory array 102 has more MTJ memory cells subject to data retention errors than redundant memory cells, the processor 130 may indicate failure of the MTJ memory array 102. In another particular embodiment, a maximum failure rate may be specified (e.g., by a user or a manufacturer), and the processor 130 may indicate failure of the MTJ memory array 102 if a percentage of MTJ memory cells subject to data retention errors exceeds the maximum failure rate. A failed MTJ memory array may be discarded or otherwise disposed of.

In a particular embodiment, the MTJ programming device 136 may be used to program the pinned layers 110, 114, the free layers 108, 112, or a combination thereof, prior to application of the external magnetic field 120. For example, the pinned layers 110, 114 may be programmed to have the first direction of magnetization 118 and the free layers 108 and 112 may be programmed to have the second direction of magnetization 116. In another particular embodiment, the MTJ programming device 136 may be used to reprogram the pinned layers 110, 114, the free layers 108, 112, or a combination thereof, after application of the external magnetic field 120 (e.g., in preparation for additional data retention error detection testing, as described below).

In a particular embodiment, the magnetic field strength of the external magnetic field 120 may be less than a magnetic field strength of a programming magnetic field used to program the pinned layers 110, 114. In another particular embodiment, the magnetic field strength of the external magnetic field 120 may be less than a magnetic field strength of a programming magnetic field used to program the free layers 108, 112. In a particular embodiment, the direction of magnetization of the pinned layers 110, 114 prior to application of the external magnetic field 120 may be parallel or antiparallel to the direction of magnetization of the free layers 108, 112. For example, the first view 150 illustrates the direction of magnetization of the pinned layers 110, 114 being antiparallel to the direction of magnetization of the free layers 108, 112. In another embodiment, the direction of magnetization of the pinned layers 110, 114 may be parallel to the direction of magnetization of the free layers 108, 112.

After determining whether any MTJ memory cell (e.g., the first MTJ memory cell 104) of the MTJ memory array 102 is subject to a data retention error based on the external magnetic field 120, each of the MTJ memory cells 104, 106 may be reprogrammed to have a parallel direction of magnetization of the pinned layers 110, 114 and the free layers 108, 112. Subsequently, the external magnetic field generator 122 may apply another external magnetic field having a different direction of magnetization (e.g., a fifth direction of magnetization opposite the new direction of magnetization of the free layers 108, 112 (a fourth direction of magnetization)). The second external magnetic field may be used to determine whether any MTJ memory cell of the MTJ memory array 102 switches to the antiparallel state indicating a data retention error which can be determined based on a logical value stored at the MTJ memory cell by performing a read operation. A magnetic field strength of the second external magnetic field may correspond to the threshold data retention time, or may correspond to another threshold data retention time. The second external magnetic field may have the same magnetic field strength as used for the first test or may have a different magnetic field strength. For example, when testing the MTJ memory cells in the antiparallel configuration, as illustrated in the first view 150, a first threshold data retention time, which corresponds to a first external magnetic field strength, may be used. When testing the MTJ memory array 102 in the parallel magnetization configuration, a second threshold data retention time, which corresponds to a second external magnetic field strength, may be used.

The controller may be configured to determine whether each MTJ memory cell of the MTJ memory array 102 is subject to a data retention error by comparing a logic value of each MTJ memory cell to a programmed logic value of the MTJ memory cell. The programmed logic value may correspond to the particular logic value of the MTJ memory cell prior to application of the external magnetic field 120. The controller may be configured to determine that a particular MTJ memory cell (e.g., the first MTJ memory cell 104) is subject to a data retention error when the controller detects a mismatch between the logical value as read after application of the external magnetic field 120 and the programmed logical value prior to application of the external magnetic field 120. Although FIG. 1 illustrates two MTJ memory cells (e.g., the first MTJ memory cell 104 and the second MTJ memory cell 106) being tested to determine whether each MTJ memory cell is subject to a data retention error, the data retention error test may be performed on MTJ memory cells individually or may be performed concurrently on more than two MTJ memory cells.

In conjunction with the described embodiments, an apparatus (such as the data retention error detection system 100) may include means for generating a magnetic field. For example, the means for generating a magnetic field may correspond to the external magnetic field generator 122. The means for generating the magnetic field may be configured to apply an external magnetic field (e.g., the external magnetic field 120) to a MTJ memory cell (e.g., the first MTJ memory cell 104). The external magnetic field may have a first direction of magnetization that is opposite to a second direction of magnetization (e.g., the second direction of magnetization 116). A free layer of the MTJ memory cell (e.g., the first free layer 108) may be configured to have the second direction of magnetization. A strength of the external magnetic field may be determined based on a threshold data retention time.

The apparatus may further include a controlling means. For example, the controlling means may correspond to a controller that includes the processor 130 and the memory 132. The controlling means may be configured to, subsequent to applying the external magnetic field, perform a read operation on the MTJ memory cell to determine a logic value of the MTJ memory cell. The controlling means may be further configured to determine whether the MTJ memory cell is subject to a data retention error corresponding to the threshold data retention time based on the logic value.

Thus, an electronic device including the data retention error detection system 100 may test the MTJ memory array 102 for potential data retention errors. The data retention error detection system 100 may test the MTJ memory array 102 for potential data retention errors more quickly than a system that tests the MTJ memory array 102 using a baking procedure.

Figure 2:
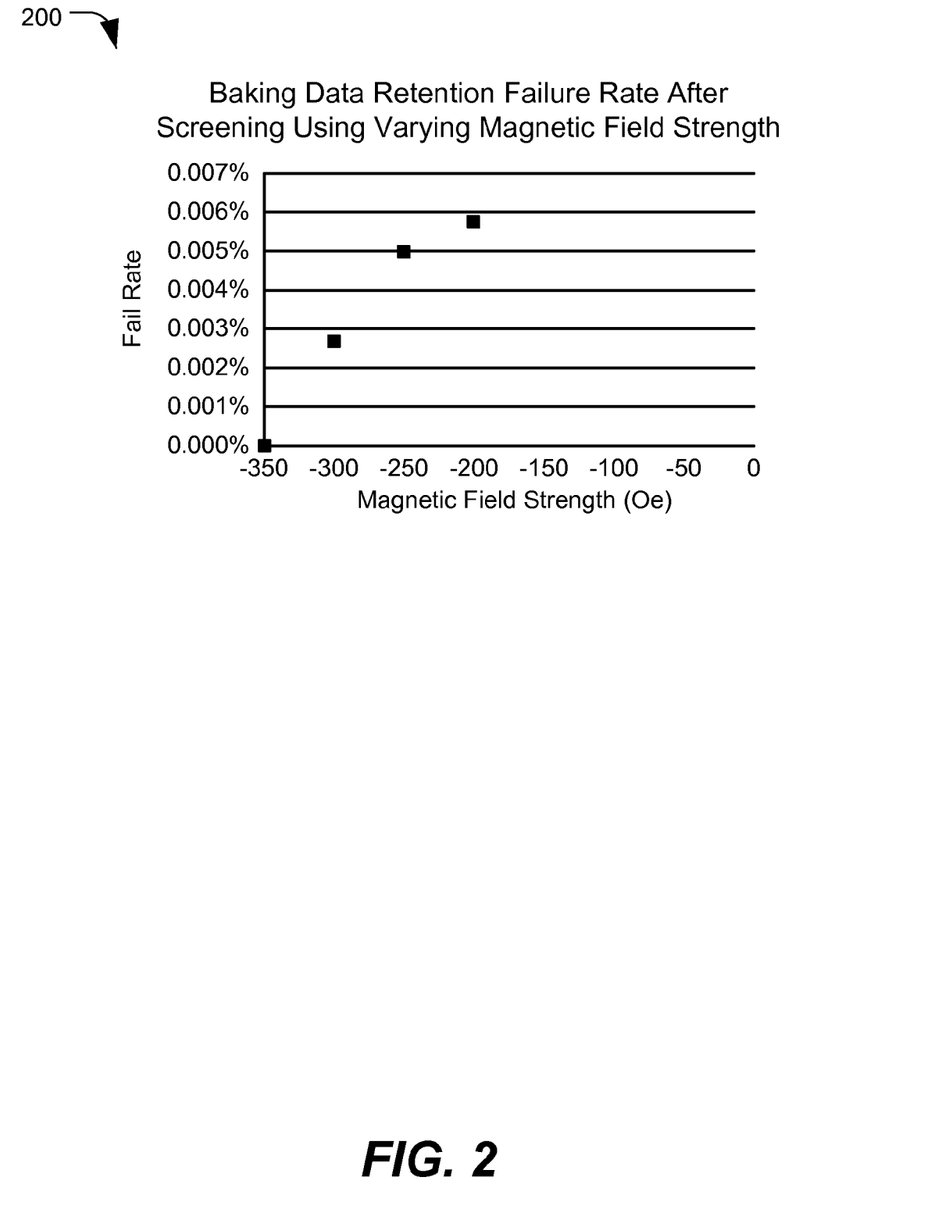
FIG. 2 is a diagram depicting a baking data retention failure rate of a magnetic tunnel junction (MTJ) memory cell after screening the MTJ memory cell using varying magnetic field strengths.

FIG. 2 illustrates a particular embodiment of a method of determining the relationship between magnetic field strength and threshold data retention time. Conventionally, data retention errors have been detected using a baking process. The baking process simulates elapsed time by exposing a magnetic tunnel junction (MTJ) memory array or set of cells to an increased temperature for a period of time. Subsequent to the baking process, the memory cells of the MTJ memory array are read to determine whether any of the cells have changed logical value with respect to a logical value programmed into each cell prior to the baking process. In the particular example illustrated in FIG. 2, the data illustrated corresponds to a baking test at 105 degrees Celsius (° C.) for approximately three days.

In FIG. 2, a graph 200 illustrates a detection failure rate of a simulated MTJ memory array of cells after exposure to varying strengths of magnetic fields. To generate the data illustrated in graph 200, the simulated memory array was subjected to a magnetic field having a varying magnetic field strength between 0 and 350 Oersteds (Oe). Subsequently, the simulated memory array cells that are not subject to a data retention error after exposure to magnetic fields having magnetic field strengths illustrated in graph 200 were baked at 105° C. for three days and tested again for data retention errors. The failure rate corresponds to a number of cells which are not subject to data retention errors after being tested using magnetic fields, but which are subject to data retention errors after being tested using the backing process. Thus, the graph 200 illustrates that no memory cells which are not subject to a data retention error after exposure to a −350 Oe magnetic field of the memory array are subject to a data retention error after a baking process at 105° C. for three days. However, approximately 0.0027% of memory cells which are not subject to a data retention error after exposure to a −300 Oe magnetic field are subject to a data retention error after the baking process. Accordingly, a −350 Oe magnetic field strength may be used to simulate a baking at 105° C. for three days. Similar processes may be used to determine corresponding magnetic field strengths that correspond to other baking test conditions, such as different temperatures or different time periods. Baking conditions may correspond to threshold data retention times. Accordingly, a magnetic field strength corresponding to a threshold data retention time can be determined for a particular desired set of conditions.

Figure 3:
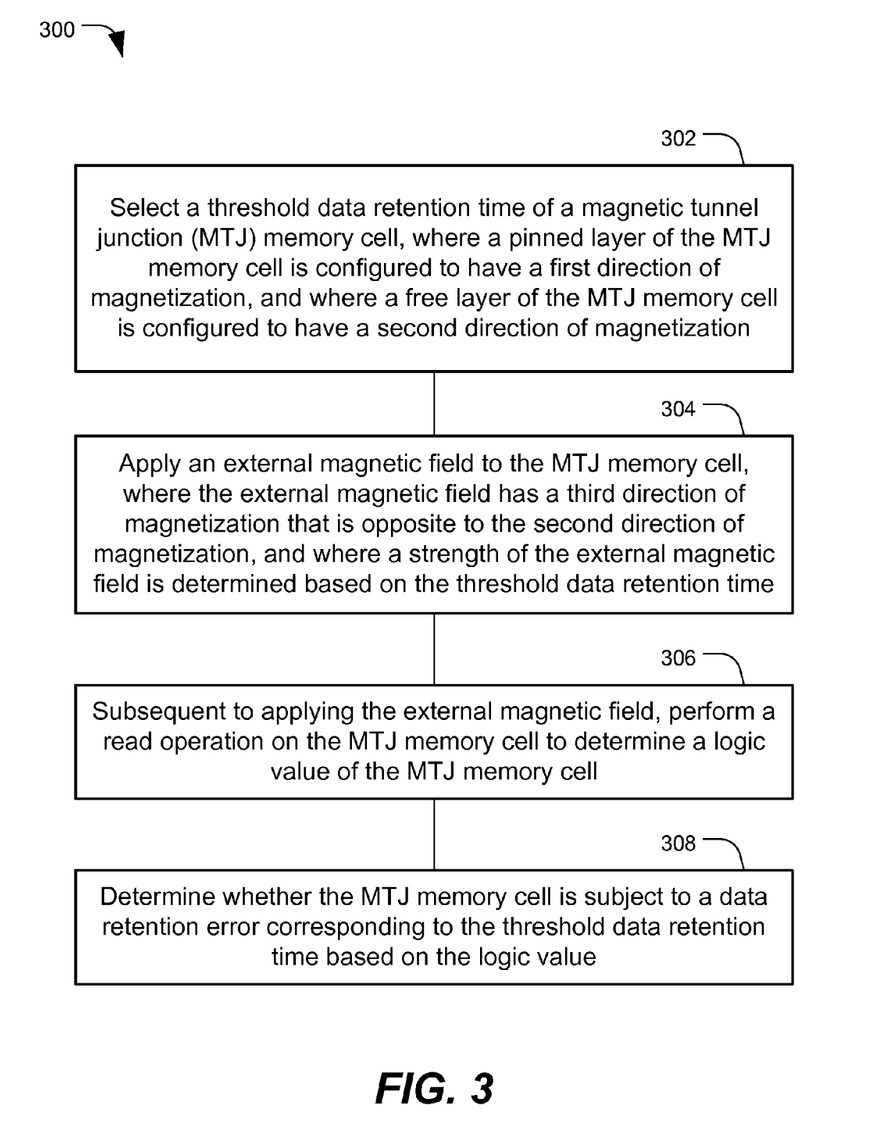
FIG. 3 is a flow chart that illustrates a method of detecting whether a MTJ memory cell is prone to being subject to a data retention error.

FIG. 3 illustrates a particular embodiment of a method of determining whether a magnetic tunnel junction (MTJ) memory cell is prone to being subject to a data retention error corresponding to a threshold data retention time. Prior to the method 300, a MTJ memory cell of a MTJ memory array may be programmed to store a particular logical value. For example, the first pinned layer 110 of the first MTJ memory cell 104 of FIG. 1 may be programmed to have a first direction of magnetization, such as the first direction of magnetization 118 illustrated in FIG. 1. In the example, a free layer of the first MTJ memory cell 104 is programmed to have a second direction of magnetization, such as the second direction of magnetization 116 of FIG. 1.

After the MTJ memory cell is programmed to store a particular logical value corresponding to the direction of magnetization of each of the pinned layer and the free layer, the method includes, at 302, selecting a threshold data retention time of the MTJ memory cell. The threshold data retention time may correspond to maintaining a data value at the MTJ memory cell for a particular amount of time. The particular amount of time may correspond to a qualification or quality metric of the MTJ memory cell. For example, a threshold data retention time of 10 years may be selected.

The method 300 also includes, at 304, applying an external magnetic field to the MTJ memory cell. The external magnetic field may have a third direction of magnetization that is opposite to the second direction of magnetization of the free layer of the MTJ memory cell. A strength of the external magnetic field may be determined based on the threshold data retention time. For example, the external magnetic field 120 of FIG. 1 may be applied to the first MTJ memory cell 104. The external magnetic field 120 has a direction of magnetization that is opposite to the direction of magnetization of the first free layer 108 (e.g., the second direction of magnetization 116). The pinned layer and the free layer may be in a parallel or antiparallel configuration depending on a particular logical value stored at the MTJ memory cell for the testing.

As described above with reference to FIG. 2, the external magnetic field strength may be selected based on a baking data retention failure rate that corresponds to a threshold data retention time. Alternatively, as described with reference to FIGS. 1 and 4, the external magnetic field strength may be selected based on empirical data, historical testing data, or both. The external magnetic field strength may simulate subjecting the MTJ memory cell to a time span corresponding to the threshold data retention time. In a particular embodiment, the magnetic field strength of the external magnetic field is less than the field strength of a programming magnetic field used to program the pinned layer. Additionally, the external magnetic field strength may be less than the magnetic field strength of the programming magnetic field used to program the free layer.

The method 300 also includes, at 306, subsequent to applying the external magnetic field, performing a read operation of the MTJ memory cell to determine a logical value stored at the MTJ memory cell. For example, the processor 130 of FIG. 1 may perform a read operation at the first MTJ memory cell 104 to determine a logical value stored at the first MTJ memory cell 104 subsequent to application of the external magnetic field 120.

The method 300 also includes, at 308, determining whether the MTJ memory cell is subject to the data retention error corresponding to the threshold data retention time based on the logical value. For example, a logical value programmed in the first MTJ memory cell 104 of FIG. 1 prior to application of the external magnetic field 120 may be compared to a logical value read subsequent to application of the external magnetic field 120. The programmed logical value may correspond to a particular logical value at the MTJ memory cell prior to application of the external magnetic field. For example, the programmed logical value may correspond to the first direction of magnetization 118 and the second direction of magnetization 116 of FIG. 1, as illustrated in the first view 150. The data retention errors are identified based on a mismatch between the logical value (e.g., the logical value read subsequent to application of the external magnetic field) and the program logical value. Because the logical value stored at the MTJ memory cell corresponds to relative directions of magnetization of the pinned layer and the free layer, a data retention error may be indicated when the direction of magnetization of the free layer has changed with respect to the pinned layer due to application of the external magnetic field. For example, a data retention error may be identified at the first MTJ memory cell 104 of FIG. 1 because the first free layer 108 of the first MTJ memory cell 104 switches from the second direction of magnetization 116 (e.g., as illustrated in the first view 150) to the third direction of magnetization 124 (e.g., as illustrated in the second view 152) based on the application of the external magnetic field 120.

In a particular embodiment, after applying the external magnetic field, the free layer may be programmed to have a fourth direction magnetization that is opposite to the second direction of magnetization. For example, a different logical value may be stored in the memory cell by changing the direction of magnetization of the free layer. A second threshold data retention time of the MTJ memory cell may be selected. Alternately, the same data retention time may be used. Subsequently, a second external magnetic field may be applied to the MTJ memory cell. The second external magnetic field may have a direction of magnetization opposite the fourth direction of magnetization. A field strength of the second external magnetic field may be determined based on the threshold data retention time to be tested (e.g., the second threshold data retention time or the first threshold data retention time). Subsequently to applying the second external magnetic field, a second read operation of the MTJ memory cell may be performed to determine the second logical value stored at the MTJ memory cell. The method 300 may also include determining whether the MTJ memory cell is subject to the data retention error corresponding to the second threshold data retention time based on the second logical value. For example, if the second logical value has changed with respect to the second programmed logical value (e.g., a mismatch is detected between the second logical value and the second programmed logical value), the data retention error is indicated.

The method 300 illustrated in FIG. 3 may be initiated by a processor integrated into an electronic device, such as a computer or a computer based tester. The method 300 may be performed during a production phase, a fabrication phase, a packaging phase, an assembly phase, or a qualification phase of a memory device that includes the MTJ memory cell, as described below with reference to FIG. 5.

Thus, an electronic device performing the method 300 may test a MTJ array for potential data retention errors. The method 300 may test the MTJ array for potential data retention errors more quickly than a system that tests the MTJ array using a baking procedure.

Figure 4:
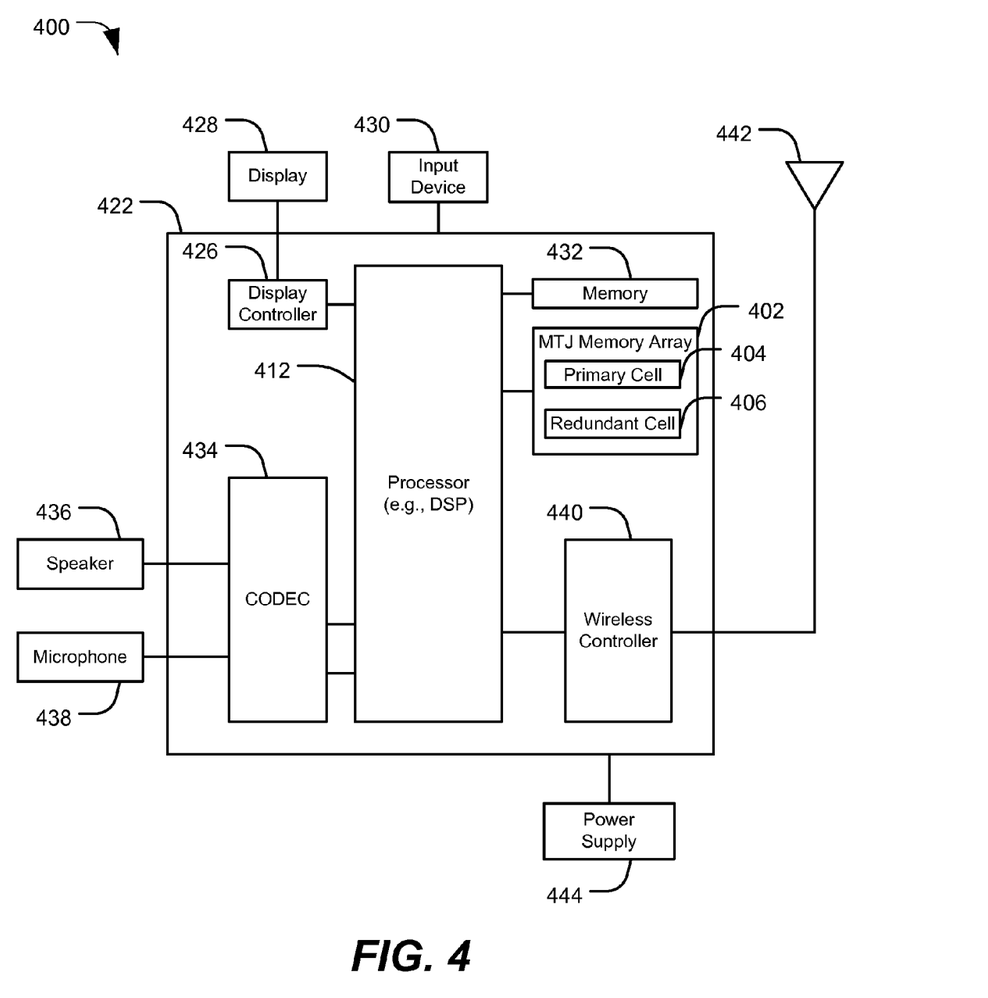
FIG. 4 is a block diagram that illustrates a communication device including a tested MTJ memory array.

Referring to FIG. 4, a block diagram depicts a particular illustrative embodiment of a mobile device that includes a magnetic tunnel junction (MTJ) memory array 402 (e.g., a portion of a memory device) that includes a primary cell 404 and a redundant cell 406, the mobile device generally designated 400. The mobile device 400, or components thereof, may include, implement, or be included within a device such as: a communications device, a mobile phone, a cellular phone, a computer, a portable computer, a tablet, an access point, a set top box, an entertainment unit, a navigation device, a personal digital assistant (PDA), a fixed location data unit, a mobile location data unit, a desktop computer, a monitor, a computer monitor, a television, a tuner, a radio, a satellite radio, a music player, a digital music player, a portable music player, a video player, a digital video player, a digital video disc (DVD) player, or a portable digital video player.

The mobile device 400 may include a processor 412, such as a digital signal processor (DSP). The processor 412 may be coupled to a memory 432 (e.g., a non-transitory computer-readable medium). The memory 432 may include the MTJ memory array 402 or may be a separate device from the MTJ memory array 402. The processor 412 may be further coupled to the MTJ memory array 402. The MTJ memory array 402 may include the primary cell 404 and the redundant cell 406. The primary cell 404 and the redundant cell 406 may correspond to MTJ memory cells that have been tested by a data retention error test, such as the data retention error test described above with reference to FIGS. 1-3. The MTJ memory array 402 may further include a memory table (e.g., a bad bit memory table) indicating bits that failed the data retention error test. In a particular embodiment, the primary cell 404 is subject to a data retention error corresponding to a particular threshold data retention time (e.g., 10 years) and the redundant cell 406 is not subject to the data retention error. A processor may be configured to remap data from the primary cell 404 to the redundant cell 406 based on the memory table of the MTJ memory array (e.g., via a memory controller that is coupled to the memory table and to the processor 412). For example, the memory controller may be configured to store data for the primary cell 404 at the redundant cell 406 in response to a write instruction. Further, the processor 412 may be configured to read data from the redundant cell 406, instead of from the primary cell 404, in response to a read instruction. The MTJ memory array 402 may correspond to the MTJ memory array 102 of FIG. 1. The primary cell 404 may correspond to the first MTJ memory cell 104 of FIG. 1. The redundant cell 406 may correspond to the second MTJ memory cell 106 of FIG. 1.

FIG. 4 also shows a display controller 426 that is coupled to the processor 412 and to a display 428. A coder/decoder (CODEC) 434 can also be coupled to the processor 412. A speaker 436 and a microphone 438 can be coupled to the CODEC 434. A wireless controller 440 can be coupled to the processor 412 and can be further coupled to an antenna 442.

In a particular embodiment, the processor 412, the display controller 426, the memory 432, the CODEC 434, the wireless controller 440, and the MTJ memory array 402 including the primary cell 404 and the redundant cell 406 are included in a system-in-package or system-on-chip device 422. An input device 430 and a power supply 444 may be coupled to the system-on-chip device 422. Moreover, in a particular embodiment, and as illustrated in FIG. 4, the display 428, the input device 430, the speaker 436, the microphone 438, the antenna 442, and the power supply 444 are external to the system-on-chip device 422. However, each of the display 428, the input device 430, the speaker 436, the microphone 438, the antenna 442, and the power supply 444 can be coupled to a component of the system-on-chip device 422, such as an interface or a controller. The MTJ memory array 402 including the primary cell 404 and/or the redundant cell 406 may be included in the system-on-chip device 422, as shown in FIG. 4, or may be included in one or more separate components.

Figure 5:
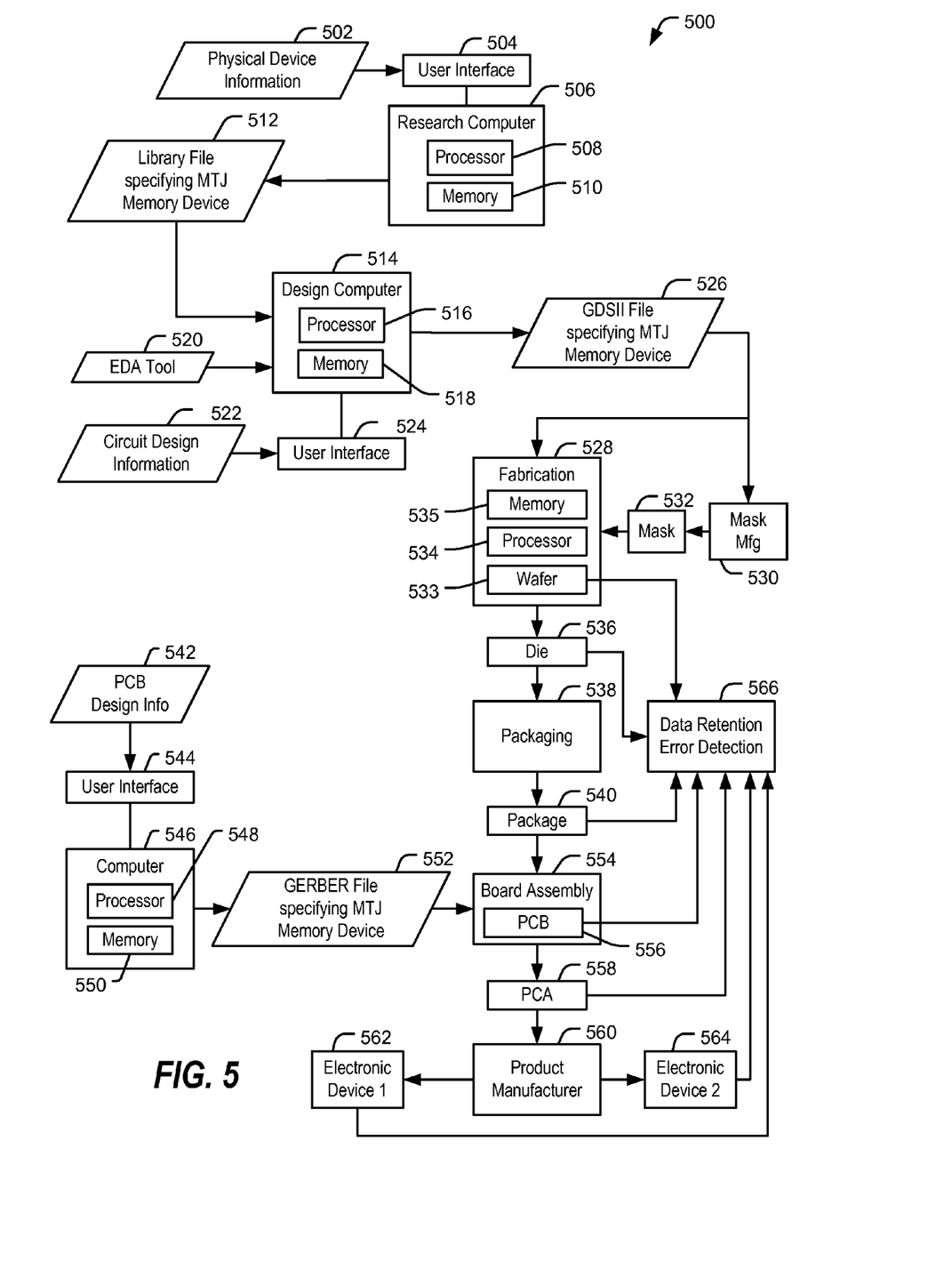
FIG. 5 is a data flow diagram that illustrates a particular illustrative embodiment of a manufacturing process to manufacture MTJ memory devices and to determine whether the MTJ memory devices are prone to being subject to data retention errors.

The foregoing disclosed devices and functionalities may be designed and configured into computer files (e.g. RTL, GDSII, GERBER, etc.) stored on computer-readable media. Some or all such files may be provided to fabrication handlers to fabricate devices based on such files. Resulting products include wafers that are then cut into dies and packaged into chips. The chips are then employed in devices described above. FIG. 5 depicts a particular illustrative embodiment of an electronic device manufacturing process 500.

Physical device information 502 is received at the manufacturing process 500, such as at a research computer 506. The physical device information 502 may include design information representing at least one physical property of an electronic device that includes one or more memories, such as a resistance-based memory device (e.g., corresponding to the magnetic tunnel junction (MTJ) memory array 102 of FIG. 1). For example, the physical device information 502 may include physical parameters, material characteristics, and structure information that is entered via a user interface 504 coupled to the research computer 506. The research computer 506 includes a processor 508, such as one or more processing cores, coupled to a computer-readable medium such as a memory 510. The memory 510 may store computer-readable instructions that are executable to cause the processor 508 to transform the physical device information 502 to comply with a file format and to generate a library file 512.

In a particular embodiment, the library file 512 includes at least one data file including the transformed design information. For example, the library file 512 may include a library of electronic devices (e.g., semiconductor devices) that includes one or more memories, such as a resistance-based memory device (e.g., corresponding to the magnetic tunnel junction (MTJ) memory array 102 of FIG. 1 or to the MTJ memory array 402 of FIG. 4), provided for use with an electronic design automation (EDA) tool 520.

The library file 512 may be used in conjunction with the EDA tool 520 at a design computer 514 including a processor 516, such as one or more processing cores, coupled to a memory 518. The EDA tool 520 may be stored as processor executable instructions at the memory 518 to enable a user of the design computer 514 to design a circuit that includes one or more memories, such as a resistance-based memory device (e.g., corresponding to the magnetic tunnel junction (MTJ) memory array 102 of FIG. 1 or to the MTJ memory array 402 of FIG. 4), using the library file 512. For example, a user of the design computer 514 may enter circuit design information 522 via a user interface 524 coupled to the design computer 514. The circuit design information 522 may include design information representing at least one physical property of an electronic device that includes one or more memories, such as a resistance-based memory device (e.g., corresponding to the magnetic tunnel junction (MTJ) memory array 102 of FIG. 1 or to the MTJ memory array 402 of FIG. 4). To illustrate, the circuit design property may include identification of particular circuits and relationships to other elements in a circuit design, positioning information, feature size information, interconnection information, or other information representing a physical property of an electronic device.

The design computer 514 may be configured to transform the design information, including the circuit design information 522, to comply with a file format. To illustrate, the file formation may include a database binary file format representing planar geometric shapes, text labels, and other information about a circuit layout in a hierarchical format, such as a Graphic Data System (GDSII) file format. The design computer 514 may be configured to generate a data file including the transformed design information, such as a GDSII file 526 that includes information describing one or more memories, such as a resistance-based memory device (e.g., corresponding to the magnetic tunnel junction (MTJ) memory array 102 of FIG. 1 or to the MTJ memory array 402 of FIG. 4), in addition to other circuits or information. To illustrate, the data file may include information corresponding to a system-on-chip (SOC) or a chip interposer component that includes one or more memories, such as a resistance-based memory device (e.g., corresponding to the magnetic tunnel junction (MTJ) memory array 102 of FIG. 1 or to the MTJ memory array 402 of FIG. 4), and that also includes additional electronic circuits and components within the SOC.

The GDSII file 526 may be received at a fabrication process 528 to manufacture one or more memories, such as a resistance-based memory device (e.g., corresponding to the magnetic tunnel junction (MTJ) memory array 102 of FIG. 1 or to the MTJ memory array 402 of FIG. 4) according to transformed information in the GDSII file 526. For example, a device manufacture process may include providing the GDSII file 526 to a mask manufacturer 530 to create one or more masks, such as masks to be used with photolithography processing, illustrated in FIG. 5 as a representative mask 532. The mask 532 may be used during the fabrication process to generate one or more wafers 533, which may be tested and separated into dies, such as a representative die 536. The die 536 includes a circuit including one or more memories, such as a resistance-based memory device (e.g., corresponding to the magnetic tunnel junction (MTJ) memory array 102 of FIG. 1 or to the MTJ memory array 402 of FIG. 4).

In a particular embodiment, the fabrication process 528 may be initiated by or controlled by a processor 534. The processor 534 may access a memory 535 that includes executable instructions such as computer-readable instructions or processor-readable instructions. The executable instructions may include one or more instructions that are executable by a computer, such as the processor 534.

The fabrication process 528 may be implemented by a fabrication system that is fully automated or partially automated. For example, the fabrication process 528 may be automated and may perform processing steps according to a schedule. The fabrication system may include fabrication equipment (e.g., processing tools) to perform one or more operations to form an electronic device. For example, the fabrication equipment may be configured to form integrated circuit elements using integrated circuit manufacturing processes (e.g., wet etching, dry etching, deposition, planarization, lithography, or a combination thereof).

The fabrication system may have a distributed architecture (e.g., a hierarchy). For example, the fabrication system may include one or more processors, such as the processor 534, one or more memories, such as the memory 535, and/or controllers that are distributed according to the distributed architecture. The distributed architecture may include a high-level processor that controls or initiates operations of one or more low-level systems. For example, a high-level portion of the fabrication process 528 may include one or more processors, such as the processor 534, and the low-level systems may each include or may be controlled by one or more corresponding controllers. A particular controller of a particular low-level system may receive one or more instructions (e.g., commands) from a high-level system, may issue sub-commands to subordinate modules or process tools, and may communicate status data back to the high-level system. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component of the fabrication system may include a processor, such as the processor 534.

Alternatively, the processor 534 may be a part of a high-level system, subsystem, or component of the fabrication system. In another embodiment, the processor 534 includes distributed processing at various levels and components of a fabrication system.

Thus, the memory 535 may include processor-executable instructions that, when executed by the processor 534, cause the processor 534 to initiate or control formation of one or more memories, such as a resistance-based memory device (e.g., corresponding to the magnetic tunnel junction (MTJ) memory array 102 of FIG. 1 or to the MTJ memory array 402 of FIG. 4).

The die 536 may be provided to a packaging process 538 where the die 536 is incorporated into a representative package 540. For example, the package 540 may include the single die 536 or multiple dies, such as a system-in-package (SiP) arrangement. The package 540 may be configured to conform to one or more standards or specifications, such as Joint Electron Device Engineering Council (JEDEC) standards.

Information regarding the package 540 may be distributed to various product designers, such as via a component library stored at a computer 546. The computer 546 may include a processor 548, such as one or more processing cores, coupled to a memory 550. A printed circuit board (PCB) tool may be stored as processor executable instructions at the memory 550 to process PCB design information 542 received from a user of the computer 546 via a user interface 544. The PCB design information 542 may include physical positioning information of a packaged electronic device on a circuit board, the packaged electronic device corresponding to the package 540 including one or more memories, such as a resistance-based memory device (e.g., corresponding to the magnetic tunnel junction (MTJ) memory array 102 of FIG. 1 or to the MTJ memory array 402 of FIG. 4).

The computer 546 may be configured to transform the PCB design information 542 to generate a data file, such as a GERBER file 552 with data that includes physical positioning information of a packaged electronic device on a circuit board, as well as layout of electrical connections such as traces and vias, where the packaged electronic device corresponds to the package 540 including one or more memories, such as a resistance-based memory device (e.g., corresponding to the magnetic tunnel junction (MTJ) memory array 102 of FIG. 1 or to the MTJ memory array 402 of FIG. 4). In other embodiments, the data file generated by the transformed PCB design information may have a format other than a GERBER format.

The GERBER file 552 may be received at a board assembly process 554 and used to create PCBs, such as a representative PCB 556, manufactured in accordance with the design information stored within the GERBER file 552. For example, the GERBER file 552 may be uploaded to one or more machines to perform various steps of a PCB production process. The PCB 556 may be populated with electronic components including the package 540 to form a representative printed circuit assembly (PCA) 558.

The PCA 558 may be received at a product manufacturer 560 and integrated into one or more electronic devices, such as a first representative electronic device 562 and a second representative electronic device 564. As an illustrative, non-limiting example, the first representative electronic device 562, the second representative electronic device 564, or both, may be selected from a mobile phone, a tablet, a computer, a communications device, a set top box, a music player, a video player, an entertainment unit, a navigation device, a personal digital assistant (PDA), and a fixed location data unit, into which one or more memories, such as a resistance-based memory device (e.g., corresponding to the magnetic tunnel junction (MTJ) memory array 102 of FIG. 1 or to the MTJ memory array 402 of FIG. 4), is integrated. As another illustrative, non-limiting example, one or more of the representative electronic devices 562 and 564 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 5 illustrates remote units according to teachings of the disclosure, the disclosure is not limited to these illustrated units. Embodiments of the disclosure may be suitably employed in any device which includes active integrated circuitry including memory and on-chip circuitry.

A device that includes one or more memories, such as a resistance-based memory device (e.g., corresponding to the magnetic tunnel junction (MTJ) memory array 102 of FIG. 1 or to the MTJ memory array 402 of FIG. 4), may be fabricated, processed, and incorporated into an electronic device, as described in the illustrative manufacturing process 500. Although various representative stages are depicted with reference to FIG. 5, in other embodiments fewer stages may be used or additional stages may be included. Similarly, the process 500 of FIG. 5 may be performed by a single entity or by one or more entities performing various stages of the manufacturing process 500.

A data retention error detection process 566, such as the data retention error detection process described with reference to FIGS. 1-4, may be performed at one or more stages of the process 500. For example, the data retention error detection process 566 is performed at a production phase (e.g., during a fabrication phase, a packaging phase, an assembly phase or, a qualification phase) of the device fabricated by the process 500 (e.g., a memory device that includes a MTJ memory cell). To illustrate, the data retention error detection process 566 may be performed during a fabrication phase (e.g., on the wafer 533 or on the die 536), during a packaging phase (e.g., on the package 540), during an assembly phase (e.g., on the PCB 556), during a qualification phase (e.g., on the PCA 558), or a combination thereof. The qualification phase may also be performed by a product manufacturer and/or by a consumer (e.g., by performing the data retention error detection process 566 on the representative electronic devices 562, 564). Accordingly, the data retention error detection process 566 may be performed by a single entity or by multiple entities.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in memory, such as random-access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM). The memory may include any form of non-transient storage medium known in the art. An exemplary storage medium (e.g., memory) is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
selecting a threshold data retention time of a magnetic tunnel junction (MTJ) memory cell, wherein a pinned layer of the MTJ memory cell is configured to have a first direction of magnetization, and wherein a free layer of the MTJ memory cell is configured to have a second direction of magnetization;
applying an external magnetic field to the MTJ memory cell, wherein the external magnetic field has a third direction of magnetization that is opposite to the second direction of magnetization, and wherein a strength of the external magnetic field is determined based on the threshold data retention time;
subsequent to applying the external magnetic field, performing a read operation on the MTJ memory cell to determine a logic value of the MTJ memory cell; and
determining whether the MTJ memory cell is subject to a data retention error corresponding to the threshold data retention time based on the logic value.

2. The method of claim 1, further comprising:
before applying the external magnetic field, programming the pinned layer to have the first direction of magnetization; and
before applying the external magnetic field, programming the free layer to have the second direction of magnetization.

3. The method of claim 2, further comprising:
after applying the external magnetic field, programming the free layer to have a fourth direction of magnetization that is opposite to the second direction of magnetization;
applying a second external magnetic field to the MTJ memory cell, wherein the second external magnetic field has a fifth direction of magnetization that is opposite to the fourth direction of magnetization, and wherein a strength of the second external magnetic field is determined based on the threshold data retention time;
subsequent to applying the second external magnetic field, performing a second read operation on the MTJ memory cell to determine a second logic value of the MTJ memory cell; and
determining whether the MTJ memory cell is subject to the data retention error corresponding to the threshold data retention time based on the second logic value.

4. The method of claim 2, further comprising:
after applying the external magnetic field, programming the free layer to have a fourth direction of magnetization that is opposite to the second direction of magnetization;
selecting a second threshold data retention time of the MTJ memory cell;
applying a second external magnetic field to the MTJ memory cell, wherein the second external magnetic field has a fifth direction of magnetization that is opposite to the fourth direction of magnetization, and wherein a strength of the second external magnetic field is determined based on the second threshold data retention time;
subsequent to applying the second external magnetic field, performing a second read operation on the MTJ memory cell to determine a second logic value of the MTJ memory cell; and
determining whether the MTJ memory cell is subject to the data retention error corresponding to the second threshold data retention time based on the second logic value.

5. The method of claim 2, wherein a magnetic field strength of the external magnetic field is less than a magnetic field strength of a programming magnetic field used to program the pinned layer.

6. The method of claim 2, wherein the third direction of magnetization is parallel to the second direction of magnetization or the third direction of magnetization is antiparallel to the second direction of magnetization.

7. The method of claim 1, wherein determining whether the MTJ memory cell is subject to the data retention error includes comparing the logic value to a programmed logic value of the MTJ memory cell, wherein the programmed logic value corresponds to a particular logic value of the MTJ memory cell prior to applying the external magnetic field, and wherein the data retention error is identified based on a mismatch between the logic value and the programmed logic value.

8. The method of claim 1, wherein the threshold data retention time corresponds to maintaining a data value at the MTJ memory cell for a particular amount of time.

9. The method of claim 1, wherein a relationship between the strength of the external magnetic field and the threshold data retention time is determined based on empirical data, historical testing data, or both.

10. The method of claim 1, wherein applying the external magnetic field, performing the read operation, and determining whether the MTJ memory cell is subject to the data retention error occur during a production phase, a fabrication phase, a packaging phase, an assembly phase or, a qualification phase of a memory device that includes the MTJ memory cell.

11. The method of claim 1, wherein the MTJ memory cell corresponds to a single bit of a memory array.

12. The method of claim 1, wherein selecting the threshold data retention time, applying the external magnetic field, performing the read operation, and determining whether the MTJ memory cell is subject to the data retention error are initiated by a processor integrated into an electronic device.

13. An apparatus comprising:
a magnetic field generation device configured to apply an external magnetic field to a magnetic tunnel junction (MTJ) memory cell, wherein the external magnetic field has a first direction of magnetization that is opposite to a second direction of magnetization, wherein a free layer of the MTJ memory cell is configured to have the second direction of magnetization, and wherein a strength of the external magnetic field is determined based on a threshold data retention time; and
a controller coupled to the magnetic field generation device and configured to:
subsequent to application of the external magnetic field to the MTJ memory cell, perform a read operation on the MTJ memory cell to determine a logic value of the MTJ memory cell; and
determine whether the MTJ memory cell is subject to a data retention error corresponding to the threshold data retention time based on the logic value.

14. The apparatus of claim 13, wherein the controller is further configured to select the threshold data retention time.

15. The apparatus of claim 13, further comprising a MTJ programming device configured to:
program a pinned layer of the MTJ memory cell to have the first direction of magnetization or the second direction of magnetization; and
program the free layer of the MTJ memory cell to have the second direction of magnetization.

16. The apparatus of claim 15, wherein the MTJ programming device comprises the magnetic field generation device.

17. The apparatus of claim 15, wherein the MTJ programming device is separate from the magnetic field generation device.

18. The apparatus of claim 15, wherein the strength of the external magnetic field is less than a magnetic field strength of a programming magnetic field used to program the pinned layer.

19. The apparatus of claim 13, wherein the threshold data retention time corresponds to maintaining a data value at the MTJ memory cell for a particular amount of time.

20. The apparatus of claim 13, wherein the controller is configured to compare the logic value to a programmed logic value of the MTJ memory cell, wherein the programmed logic value corresponds to a particular logic value of the MTJ memory cell prior to applying the external magnetic field.

21. The apparatus of claim 20, wherein the controller is configured to determine that the MTJ memory cell is subject to the data retention error when the controller detects a mismatch between the logic value and the programmed logic value.

22. The apparatus of claim 13, wherein the controller determines the strength of the external magnetic field based on relationship data that describes a relationship between a magnetic field strength and the threshold data retention time, wherein the relationship data is based on empirical data, historical testing data, or both.

23. The apparatus of claim 13, wherein the MTJ memory cell corresponds to a single bit of a memory array.

24. The apparatus of claim 13, integrated in at least one die.

25. An apparatus comprising:
means for generating a magnetic field configured to apply an external magnetic field to a magnetic tunnel junction (MTJ) memory cell, wherein the external magnetic field has a direction of magnetization that is opposite to a direction of magnetization of a free layer of the MTJ memory cell, and wherein a strength of the external magnetic field is determined based on a threshold data retention time; and
controlling means coupled to the means for generating the magnetic field and configured to:
subsequent to application of the external magnetic field to the MTJ memory cell, perform a read operation on the MTJ memory cell to determine a logic value of the MTJ memory cell; and
determine whether the MTJ memory cell is subject to a data retention error corresponding to the threshold data retention time based on the logic value.

26. The apparatus of claim 25, integrated in at least one die.

27. An apparatus comprising:
a memory device comprising a plurality of magnetic tunnel junction (MTJ) memory cells, the plurality of MTJ memory cells including:
a primary cell that, when exposed to an external magnetic field, is subject to a data retention error corresponding to a threshold data retention time, wherein the external magnetic field has a magnetic field strength determined based on the threshold data retention time; and
a redundant cell that, when exposed to the external magnetic field, is not subject to the data retention error,
wherein data for the primary cell is stored at the redundant cell in response to a write instruction, and
wherein data is read from the redundant cell instead of the primary cell in response to a read instruction.

28. The apparatus of claim 27, wherein the plurality of MTJ memory cells have been tested by a testing process comprising:
for each memory cell of the plurality of MTJ memory cells, wherein a pinned layer of the memory cell is configured to have a first direction of magnetization, and wherein a free layer of the memory cell is configured to have a second direction of magnetization:
applying the external magnetic field to the memory cell, wherein the external magnetic field has a third direction of magnetization that is opposite to the second direction of magnetization;
subsequent to applying the external magnetic field, performing a read operation on the memory cell to determine a logic value of the memory cell; and
determining whether the memory cell is subject to the data retention error based on the logic value.

29. The apparatus of claim 27, wherein a number of MTJ memory cells of the memory device that are subject to the data retention error is smaller than a threshold that is based on an amount of redundant memory cells at the memory device, based on a specified maximum failure rate, or both.

30. The apparatus of claim 27, further comprising a device selected from a mobile phone, a tablet, a computer, a communications device, a set top box, a music player, a video player, an entertainment unit, a navigation device, a personal digital assistant (PDA), and a fixed location data unit into which the memory device is integrated.

* * * * *